(12) United States Patent
Nagaushi

(10) Patent No.: US 7,714,672 B2
(45) Date of Patent: May 11, 2010

(54) SURFACE-MOUNT CRYSTAL OSCILLATOR

(75) Inventor: Hideo Nagaushi, Sayama (JP)

(73) Assignee: Nihon Dempa Kogyo Co., Ltd (JP)

( * ) Notice: Subject to any disclaimer, the term of this patent is extended or adjusted under 35 U.S.C. 154(b) by 48 days.

(21) Appl. No.: 11/965,301

(22) Filed: Dec. 27, 2007

(65) Prior Publication Data

US 2008/0157885 A1 Jul. 3, 2008

(30) Foreign Application Priority Data

Dec. 28, 2006 (JP) .............................. 2006-355483

(51) Int. Cl.
H03B 1/00 (2006.01)
(52) U.S. Cl. ........................................ 331/68; 331/158
(58) Field of Classification Search .................. 331/68, 331/69, 158, 116 R; 310/331, 348, 345
See application file for complete search history.

(56) References Cited

U.S. PATENT DOCUMENTS 6,137,184 A * 10/2000 Ikegami ...................... 257/785
6,674,178 B1 * 1/2004 Ikegami ...................... 257/789
2004/0135645 A1 * 7/2004 Koyama et al. ............. 331/158

FOREIGN PATENT DOCUMENTS

JP 2005-151536 6/2005

* cited by examiner

*Primary Examiner*—Robert Pascal
*Assistant Examiner*—Ryan J Johnson
(74) *Attorney, Agent, or Firm*—Schwegman, Lundberg & Woessner, P.A.

(57) ABSTRACT

The crystal oscillator has a configuration where circuit elements including a crystal unit are arranged on a mounting board comprising external terminals, opening end faces of a concave metal cover are made to touch the surface of the mounting board, clearances from the opening end faces are comprised in the central regions at both ends in the width direction of the metal cover, protruding parts, which extend from the opening end faces and have a protrusion on an inner face, are comprised at both ends in the longitudinal direction of the metal cover, and each of the protruding parts is elastically inserted in a groove provided on both side faces in the longitudinal direction of the mounting board 1 and bonded by solder, wherein the tip side of each protrusion is thrust and bites into a metal film provided in the groove.

6 Claims, 3 Drawing Sheets

SURFACE-MOUNT CRYSTAL OSCILLATOR

RELATED APPLICATION

This application claims priority under 35 U.S.C. 119 to Japanese Patent Application No. 2006-355483 filed Dec. 28, 2006, which application is incorporated herein by reference and made a part hereof.

BACKGROUND OF THE INVENTION

1. Field of the Invention

The present invention relates to a technique of a crystal oscillator composed of discrete elements, and more particularly, to a technique for preventing a metal cover, which is used for a surface-mount oscillator of a voltage control type, from separating at the time of solder reflow.

2. Description of the Related Art

In recent years, a surface-mount crystal oscillator (surface-mount oscillator) of a voltage control type has been incorporated into various types of electronic appliances, for example, as a reference frequency source of a PLL circuit, since its oscillation frequency in response to a control voltage is stable owing to a crystal unit.

FIGS. 1A and 1B are schematic diagrams explaining a conventional example of a surface-mount oscillator. FIG. 1A is its disassembled view, whereas FIG. 1B is an enlarged cross-sectional view of a portion of both ends taken along a line A-A of FIG. 1A.

A surface-mount oscillator has a configuration where a crystal unit 2a, an IC 2b, and other circuit elements 2c are arranged on a mounting board 1, which is covered with a metal cover 3. The mounting board 1 is rectangular in shape when viewed from a plane, and comprises at least four external terminals not shown on an outer bottom of both sides of a width direction. Each of the external terminals extends to the outer bottom via a side electrode 5 provided in a groove 4a in a central region.

The metal cover 3 is concave in shape, and comprises clearances 6 from opening end faces at both sides in the width direction, and the opening end faces are made to touch the perimeter surface of the mounting board 1. In central portions at both ends in the longitudinal direction of the metal cover 3, protruding parts 8, each of which has a protrusion 7 provided on an inner face, are comprised. Each of the protruding parts 8 is elastically inserted in a groove 4b provided on both side faces in the longitudinal direction of the mounting board 1.

The groove 4b has a bottom wall layer on the side of the outer bottom, and a metal film 9 the material of which is the same as the side electrode 5 is provided on the entire inner face. The primary coat of the metal film 9 is, for example, Cu (copper), and its surface is Au-plated. Each of the protruding parts 8 of the metal cover 3 is bonded to the metal film 9 of the groove 4b by solder 10 from the outer surface. Note that the groove 4b is broader than the width of the protruding part 8. As a result, the solder 10 comes inside from the perimeter of the protruding part 8, and entirely bonds to the metal film 9.

Also protruding parts 11 for alignment are provided on both side faces at one end in the longitudinal direction of the metal cover 3. Each of the protruding parts 11 is inserted in a groove 4c of the mounting board 1, so that the metal cover 3 is pre-aligned. Such surface-mount oscillators are mounted on a set board not shown, for example, with solder reflow. The solder includes lead-free solder.

Additionally, the proposal recited in Japanese Published Unexamined Patent Application No. 2005-151536 is made.

However, the surface-mount oscillator having the above described configuration has a problem that the metal cover 3 is separated or displaced due to the melting of also solder coated on the grooves 4b at both sides in the longitudinal direction at the time of user's mounting with solder reflow. This problem conspicuously occurs, for example, when a user mounts surface-mount components on a set board the both surfaces of which are used for mounting.

Namely, this problem is caused, for example, by an upside-down surface-mount oscillator that is beforehand provided on one surface of a set board, which is then reversed when other surface-mount components are solder-reflowed on another surface. Namely, this problem occurs due to the low elastic force of the protrusions 7 of the protruding parts 8 in the surface-mount oscillator.

SUMMARY OF THE INVENTION

The present invention was developed in light of the above described circumstances, and an object thereof is to provide a surface-mount crystal oscillator that prevents the separation and the displacement of a metal cover from a mounting board.

The surface-mount crystal oscillator has a configuration where circuit elements including a crystal unit are arranged on a mounting board comprising external terminals, opening end faces of a concave metal cover are made to touch the surface of the mounting board, clearances from the opening end faces are comprised in central regions at both ends in the width direction of the metal cover, protruding parts, which extend from the opening end faces and have a protrusion provided on an inner face, are comprised at both ends in the longitudinal direction of the metal cover, and each of the protruding parts is elastically inserted in a groove provided on both side faces in the longitudinal direction of the mounting board and bonded by solder, wherein the tip side of the protrusion is thrust and bites into a metal film provided in the groove.

According to claim 2, the plate thickness of the tip side of the protrusion is smaller than the thickness of the metal film, and one half or more of the plate thickness is buried and thrust in the film thickness. As a result, one half or more of the plate thickness of the tip side of the protrusion is buried in the thickness of the metal film, thereby making the biting of the tip side into the metal film sufficient. Accordingly, the separation and the displacement of the metal cover can be securely prevented.

According to claim 3, the metal cover is made harder than the metal film of the mounting board. As a result, the metal cover becomes harder than the metal film, thereby making it easy to thrust the tip side of the protrusion.

According to claim 4, the mounting board is made of glass epoxy, a body of the metal cover is made of brass and Ni-plated, and the metal film, which is a base electrode, is made of Cu and its surface is Au-plated. As a result, the metal cover becomes harder than the metal film.

According to claim 5, the tip side of the protrusion is pressed and thrust in a horizontal direction in the metal film provided in the groove. As a result, the tip side of the protrusion can be securely thrust in the metal film.

According to claim 6, the outer bottom of the mounting board has external terminals, which are bonded to a set board with solder reflow. This prevents the displacement and the separation of the metal cover at the time of solder reflow of the surface-mount oscillator.

With such a configuration, the tips of the protrusions at both ends, which are provided in the protruding parts of the metal cover, are made to bite into the metal film, whereby the separation and the displacement of the metal cover can be prevented, for example, if solder melts at the time of mounting on a set board. In this case, the tips of the protrusions are thrust in the metal film, for example, by being pressed with a jig, etc. from both side faces after being inserted in the grooves of the mounting board 1.

DESCRIPTION OF THE PREFERRED EMBODIMENTS

A preferred embodiment according to the present invention is described in detail below with reference to the drawings.

Figure 1A:
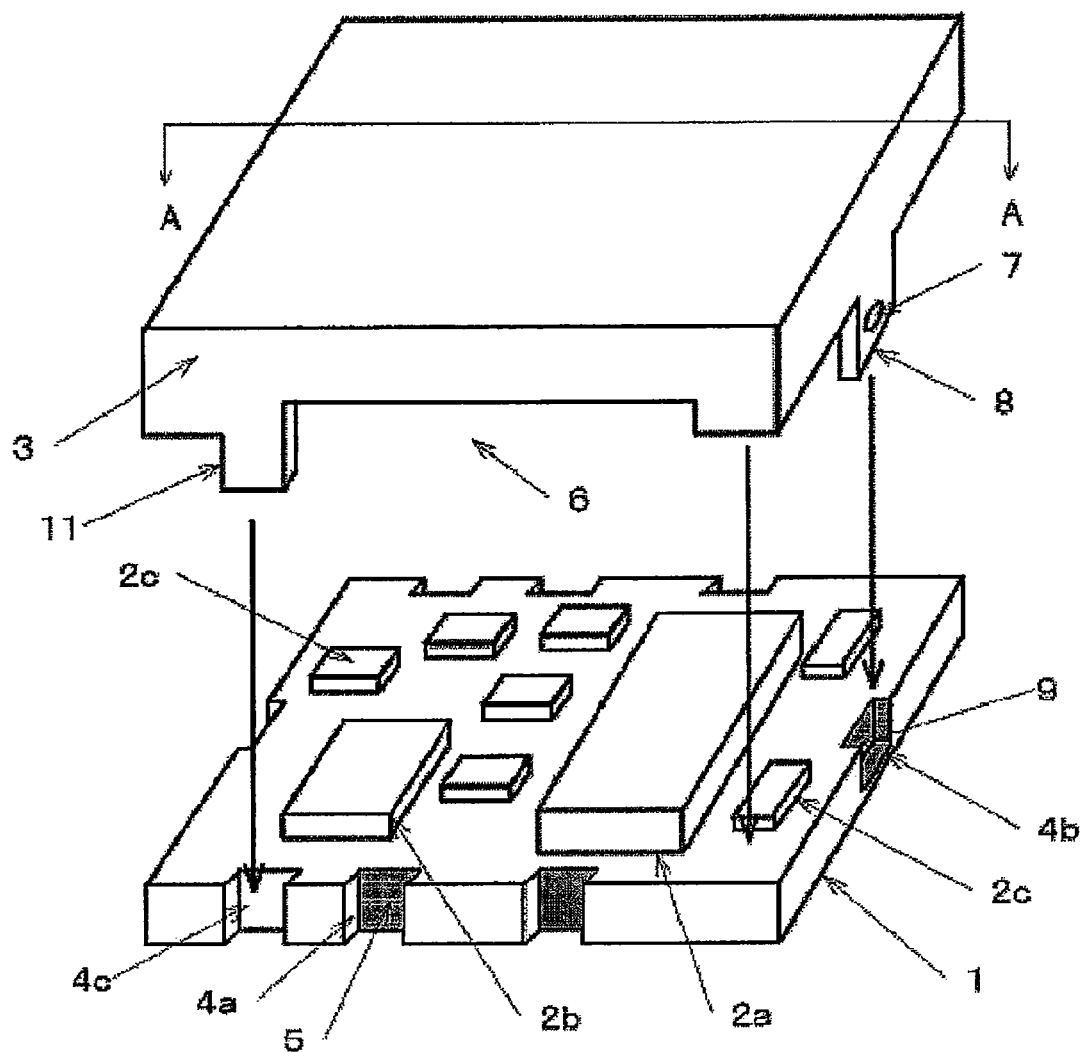
FIG. 1A is a schematic diagram showing a disassembled view of a surface-mount oscillator of a conventional example.
Figure 1B:
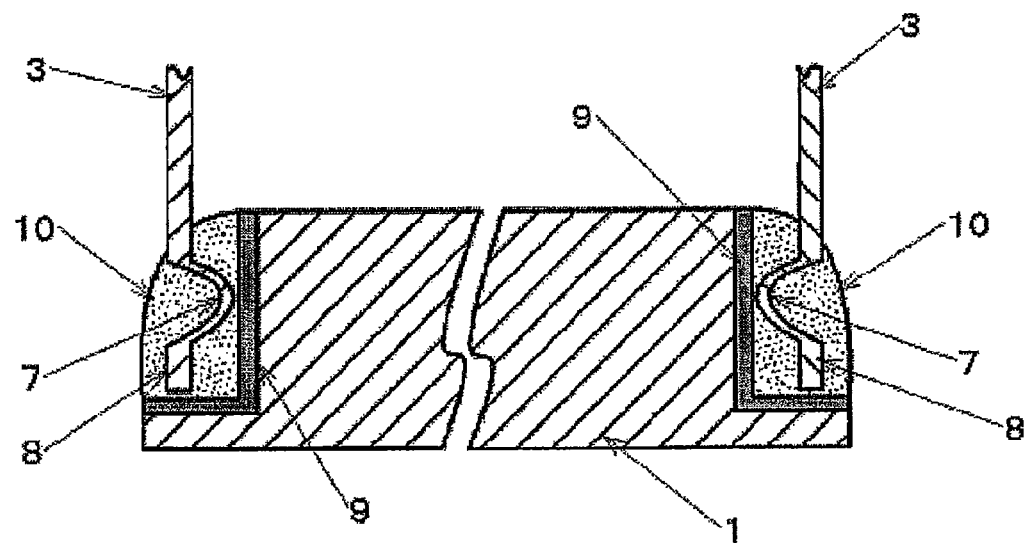
FIG. 1B is an enlarged cross-sectional view of a portion of both ends taken along a line A-A of FIG. 1A.
Figure 2:
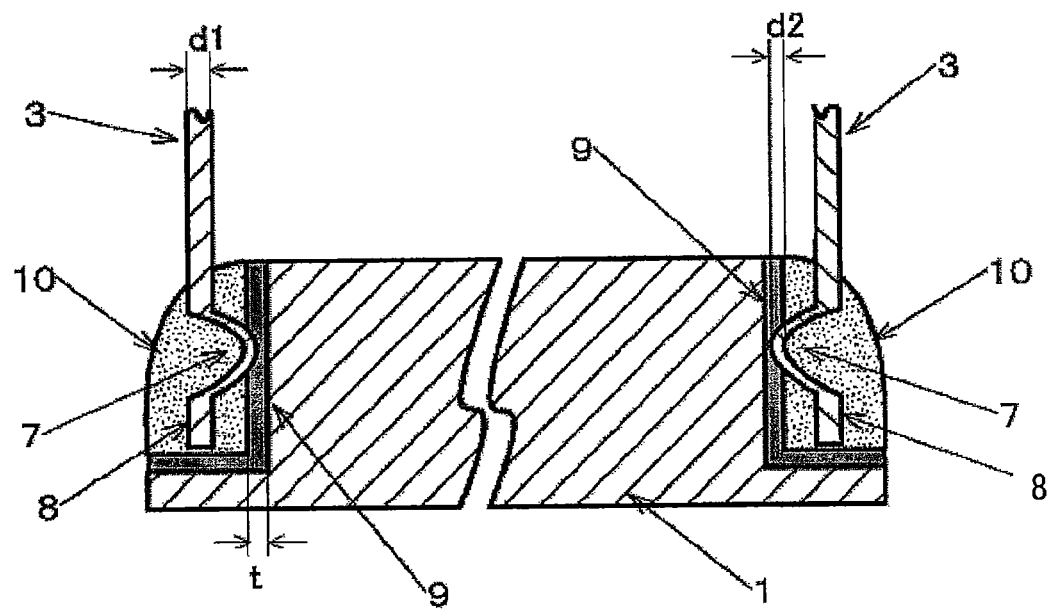
FIG. 2 is an enlarged cross-sectional view showing a portion of both ends of a surface-mount oscillator according to a preferred embodiment of the present invention.

FIG. 2 is an enlarged cross-sectional view showing a portion of both ends of a surface-mount crystal oscillator (surface-mount oscillator) according to a preferred embodiment of the present invention. The same constituent elements as those shown in FIG. 1 are denoted with the same reference numerals, and their descriptions are simplified or omitted.

As described above, the surface-mount oscillator has a configuration where a crystal unit 2a, an IC 2b, and other circuit elements 2c are arranged on a mounting board 1 on which external terminals 4 are provided, and the mounting board 1 is covered with a metal cover 3. For the metal cover 3, its protruding parts 8, which have a protrusion 7 on an inner face and are provided at both ends in the longitudinal direction, are elastically inserted in grooves 4b provided on both side faces in the longitudinal direction of the mounting board 1 (see FIG. 1).

A metal film 9 is provided in each of the grooves 4b. The primary coat of the metal film 9 is Cu (copper), and Au-plated also here. For the metal cover 3, its body is made of brass, and Ni-plated. The thickness t of the metal film 9 in this embodiment is assumed to be 0.05 mm. The plate thickness d1 of the protruding part of the metal cover 3 is assumed to be 0.2 mm, and the plate thickness d2 of the tip side of the protrusion 7 is assumed to be 0.03 mm. The protrusion 7 is formed, for example, with press work.

Figure 3A:
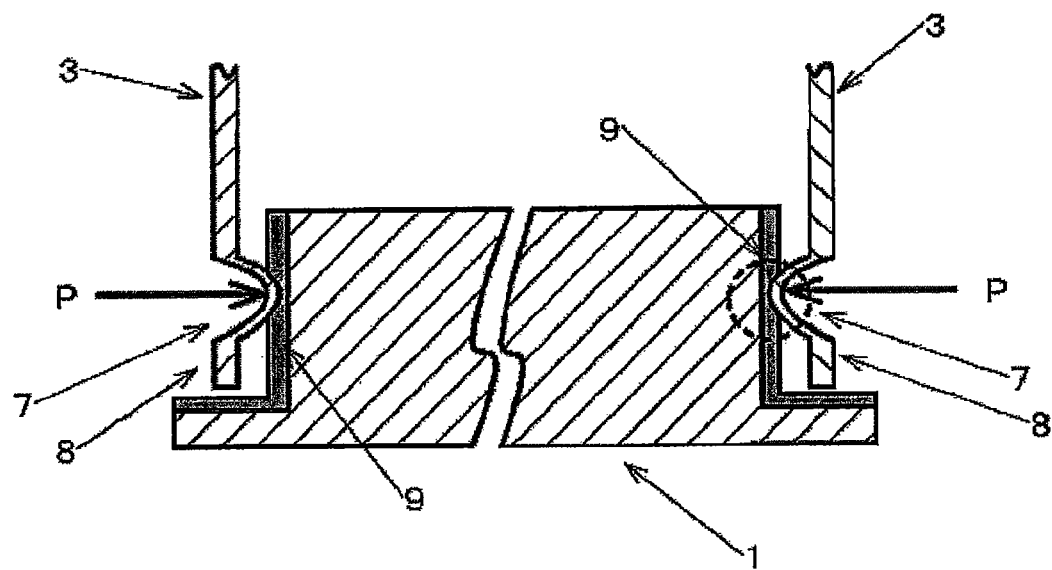
FIG. 3A is an enlarged cross-sectional view showing a portion of both ends of a surface-mount oscillator implemented as a specific manufacturing example according to a preferred embodiment of the present invention.

Here, the protruding parts 8 of the metal cover 3 are elastically inserted in the grooves 4b of the mounting board 1, and pressed with a jig, etc. not shown from the sides of both ends in the longitudinal direction as indicated by arrows P (see FIG. 3A). Desirably, the pressing direction is the horizontal direction as indicated by the arrows P. However, the pressing direction is not limited to the horizontal direction, and may be any direction as far as the protruding parts 8 can be made to bite into the metal film 9.

Figure 3B:
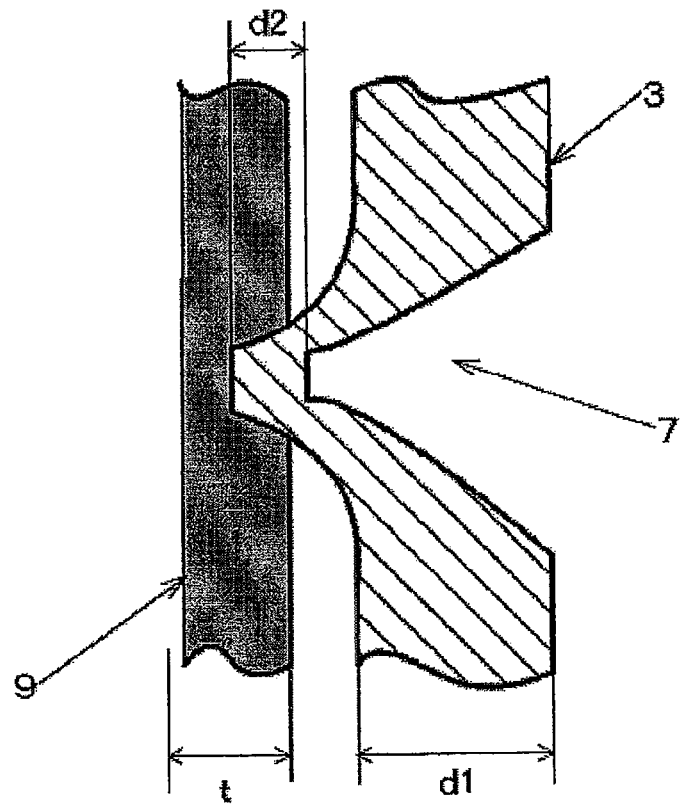
FIG. 3B is an enlarged cross-sectional view showing a portion, which is indicated by a dotted circle of FIG. 3A, of the specific manufacturing example according to the preferred embodiment of the present invention.

Here, as represented by an enlarged cross-sectional view (FIG. 3B) of a portion indicated by a dotted circle shown in FIG. 3A, the tip of the protrusion 7 bites into the metal film 9 by almost one half of the thickness from the surface of the metal film 9, and one half or more of the plate thickness is buried. Then, the metal cover 3 is bonded (adhered) with solder 10 from the outer surfaces of the protruding parts 8 as described above.

Such a configuration prevents the separation and the displacement of the metal cover 3 since the tip sides of the protrusions 7 bite into the metal film 9 by being thrust into the metal film 9 even if solder for bonding the protruding parts 8 to the grooves 4b melts, for example, by heat produced at the time of solder reflow for mounting on a set board when the protruding parts 8 of the metal cover 3 are bonded to the grooves 4b of the mounting board 1.

Especially, the biting of tip sides of the protrusions 7 is made sufficient here because one half or more of the plate thickness d2 of the protrusions 7 is buried in the thickness t of the metal film 9. Accordingly, this is especially effective when surface-mount electronic components are solder-reflowed on the upper surface of a set board after a surface-mount oscillator is mounted on the lower surface of the set board the both surfaces of which are used for mounting.

Additionally, the body of the metal cover 3 is made of brass, and Ni-plated here. Therefore, the metal cover 3 becomes harder than the metal film 9 the body of which is made of Cu and Au-plated. This makes it easier to thrust the tip sides of the protrusions 7 of the protruding parts 8. Since the mounting board 1 is made of glass epoxy, the body of the metal film is made of Cu and Au-plated in normal cases.

The above described configuration makes the metal cover 3 harder than the metal film of the mounting board. As a result, the metal cover 3 becomes harder than the metal film, thereby making it easier to thrust the tip sides of the protrusions 7.

Furthermore, the mounting board 1 is made of glass epoxy, the body of the metal cover 3 is made of brass and Ni-plated, the metal film, which is the base electrode, is made of Cu and its surface is Au-plated. As a result, the metal cover 3 becomes harder than the metal film.

The present invention is not limited to the above described preferred embodiment. Various improvements and modifications can be made within the scope that does not depart from the spirit of the present invention.

What is claimed is:

1. A surface-mount crystal oscillator having a configuration where circuit elements including a crystal unit are arranged on a mounting board comprising external terminals, opening end faces of a concave metal cover are made to touch a surface of the mounting board, clearances from the opening end faces are comprised in central regions at both ends in a width direction of the metal cover, a plurality of protruding parts, which extend from the opening end faces and each of the plurality of protruding parts having a protrusion provided on an inner face, the plurality of protruding parts are comprised at both ends in a longitudinal direction of the metal cover, each of the plurality of protruding parts is elastically inserted in a corresponding groove provided on one of a plurality of side faces in the longitudinal direction of the mounting board and bonded by solder, wherein on each of the plurality of protruding parts, a tip side of the protrusion is thrust and bites into a metal film provided in the corresponding groove.

2. The surface-mount crystal oscillator according to claim 1, wherein the metal cover is harder than the metal film of the mounting board.

3. The surface-mount crystal oscillator according to claim 1, wherein
the mounting board is made of glass epoxy, a body of the metal cover is made of brass and Ni-plated, a base electrode of the metal film is made of Cu and a surface of the metal film is Au-plated.

4. The surface-mount crystal oscillator according to claim 1, wherein
the tip side of the protrusion is pressed and thrust in a horizontal direction in the metal film provided in the groove.

5. The surface-mount crystal oscillator according to claim 1, wherein
an outer bottom of the mounting board has external terminals, which are bonded to a set board with solder reflow.

6. A surface-mount crystal oscillator having a configuration where circuit elements including a crystal unit are arranged on a mounting board comprising external terminals, opening end faces of a concave metal cover are made to touch a surface of the mounting board,
clearances from the opening end faces are comprised in central regions at both ends in a width direction of the metal cover,
a plurality of protruding parts, which extend from the opening end faces and each of the plurality of protruding parts having a protrusion provided on an inner face, the plurality of protruding parts are comprised at both ends in a longitudinal direction of the metal cover, and each of the plurality of protruding parts is elastically inserted in a corresponding groove provided on one of a plurality of side faces in the longitudinal direction of the mounting board and bonded by solder,
wherein on each of the plurality of protruding parts, a tip side of the protrusion is thrust and bites into a metal film provided in the corresponding groove, and
wherein a plate thickness of the tip side of the protrusion is smaller than a thickness of the metal film, and one half or more of the plate thickness is buried and thrust in the film thickness.

* * * * *